(12) United States Patent
Huang et al.

(10) Patent No.: US 10,612,971 B2
(45) Date of Patent: Apr. 7, 2020

(54) PLASMONIC AVALANCHE PHOTODETECTION

(71) Applicant: HEWLETT PACKARD ENTERPRISE DEVELOPMENT LP, Houston, TX (US)

(72) Inventors: Zhihong Huang, Palo Alto, CA (US); Di Liang, Santa Barbara, CA (US); Charles M Santori, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 351 days.

(21) Appl. No.: 15/316,621

(22) PCT Filed: Jul. 28, 2014

(86) PCT No.: PCT/US2014/048458
§ 371 (c)(1),
(2) Date: Dec. 6, 2016

(87) PCT Pub. No.: WO2016/018224
PCT Pub. Date: Feb. 4, 2016

(65) Prior Publication Data
US 2017/0199078 A1 Jul. 13, 2017

(51) Int. Cl.
*G01J 1/44* (2006.01)
*H01L 31/107* (2006.01)
*H01L 31/101* (2006.01)
*G01J 1/04* (2006.01)

(52) U.S. Cl.
CPC ............ *G01J 1/44* (2013.01); *G01J 1/0407* (2013.01); *H01L 31/101* (2013.01); *H01L 31/107* (2013.01); *G01J 2001/4466* (2013.01)

(58) Field of Classification Search
CPC .... G01J 1/44; G01J 1/0407; G01J 2001/4466; H01L 31/101; H01L 31/107
See application file for complete search history.

(56) References Cited

U.S. PATENT DOCUMENTS

| | | | |
|---|---|---|---|
| 7,991,294 B2 | 8/2011 | Dreischer et al. | |
| 8,772,729 B1 | 7/2014 | Brown et al. | |
| 8,829,452 B1 * | 9/2014 | Brown | H01L 31/035218 250/370.07 |
| 9,202,952 B2 * | 12/2015 | Knight | H01L 31/0384 |

(Continued)

FOREIGN PATENT DOCUMENTS

WO WO-2013058715 A1 4/2013

OTHER PUBLICATIONS

PCT/ISA/KR, International Search Report, dated Apr. 24, 2015, PCT/US2014/048458, 13 pages.

(Continued)

*Primary Examiner* — Georgia Y Epps
*Assistant Examiner* — Don J Williams
(74) *Attorney, Agent, or Firm* — Sheppard Mullin Richter & Hampton LLP

(57) ABSTRACT

Plasmonic avalanche photodetection employs an optical antenna and an avalanche photodiode (APD) coupled to the optical antenna. Hot carriers generated by light incident on the optical antenna are received in an avalanche multiplication region of the APD where avalanche multiplication of the hot carriers is provided.

20 Claims, 5 Drawing Sheets

(56) References Cited

U.S. PATENT DOCUMENTS

| | | | |
|---|---|---|---|
| 2003/0178636 A1* | 9/2003 | Kwan | H01L 31/0304 257/186 |
| 2010/0208845 A1 | 8/2010 | Charbon et al. | |
| 2011/0100440 A1* | 5/2011 | Schmidt | H01G 9/2045 136/255 |
| 2012/0147907 A1* | 6/2012 | Kim | H01S 5/06258 372/4 |
| 2012/0280209 A1 | 11/2012 | Bonnell et al. | |
| 2013/0292741 A1 | 11/2013 | Huang et al. | |
| 2014/0010547 A1 | 1/2014 | Dong et al. | |
| 2014/0191188 A1* | 7/2014 | Vassant | G02F 1/00 257/13 |

OTHER PUBLICATIONS

Dume, B., Nanowires for New Avalanche Photodetectors [online], Jan. 11, 2013, Retrieved from the Internet <http://nanotechweb.org/cws/article/tech/51998> [retrieved on Jun. 25, 2014].

Knight, Mark W., et al., Photodetection with Active Optical Antennas. May 6, 2011, Science, vol. 332, pp. 702-704.

Senanayake, P., 3D Nanopillar Optical Antenna Avalanche Detectors [online], UCLA Engineering, Henry Samueli School of Engineering and Applied Science, Feb. 18, 2014 Retrieved from the Internet.

Ulrich, L. et al., A4.2: Towards Single Photon Organic Semiconductor Devices [online], Light Technology Institute, KIT, Retrieved from the Internet <https://www cfn kit edu/972 php> [retrieved on Jun. 25, 2014].

Chalabi et al., "Hot-electron photodetection with a plasmonic nanostripe antenna", Nano Lett., vol. 14, No. 3, pp. 1374-1380, Mar. 2014.

\* cited by examiner

PLASMONIC AVALANCHE PHOTODETECTION

CROSS-REFERENCE TO RELATED APPLICATIONS

N/A

STATEMENT REGARDING FEDERALLY SPONSORED RESEARCH OR DEVELOPMENT

N/A

BACKGROUND

Optoelectronic devices used in modern optoelectronic and photonic applications generally include one or more of an emitter, an optical modulator, and a photodetector. For example, an emitter such as, but not limited to, a laser or a light emitting diode (LED) may be used to generate light, while an optical modulator may be employed to modulate one or both of an amplitude and a phase of light in various optoelectronic and photonic applications. Photodetectors such as, but not limited to, photodiodes, are often used to receive and detect light in modern optoelectronic and photonic applications, for example. In particular, semiconductor photodetectors often based on p-n and p-i-n semiconductor junctions (e.g., PN photodiodes, PIN photodiodes, etc.) and related photovoltaic devices are very common in modern photonic systems.

In general, semiconductor photodetectors provide high performance (e.g., high speed) with concomitant exceptionally good reliability at relatively low cost. For example, an avalanche photodiode (APD) may provide both conversion of incident light into a photocurrent and a 'built-in' first stage photocurrent gain through avalanche multiplication resulting in a relatively high sensitivity in many photodetection applications.

Unfortunately, while semiconductor photodetectors generally enjoy wide applicability, usefulness of a given semiconductor in certain instances may be limited by a band gap of the semiconductor. In particular, it may be difficult to realize a desired absorption spectrum or photo-response for an arbitrary semiconductor in a specific photodetector application. For example, an 'all-silicon' photodetector (e.g., APD) may be attractive in terms of manufacturing cost and ease of integration with other circuitry (e.g., with complimentary metal-oxide semiconductor circuitry). However, silicon has a relatively large band gap that may effectively preclude its use in certain photodetection applications where an optical wavelength (or photon energy) is not well matched to such a large band gap (e.g., various telecommunications applications). In such instances, it is common to employ other semiconductors with narrower band gaps either instead of silicon (e.g., indium phosphide, indium gallium arsenide, etc.) or in combination with silicon (e.g., germanium-silicon).

BRIEF DESCRIPTION OF THE DRAWINGS

Various features of examples in accordance with the principles described herein may be more readily understood with reference to the following detailed description taken in conjunction with the accompanying drawings, where like reference numerals designate like structural elements, and in which.

Figure 1:
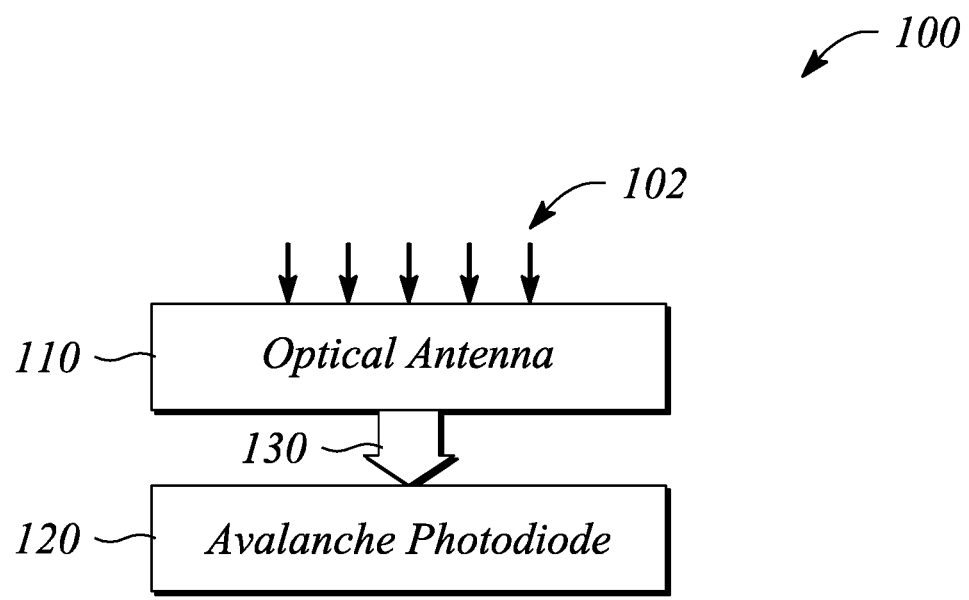
FIG. 1 illustrates a block diagram of a plasmonic avalanche photodetector, according to an example consistent with the principles described herein.

Certain examples have other features that are one of in addition to and in lieu of the features illustrated in the above-referenced figures. These and other features are detailed below with reference to the above-referenced figures.

DETAILED DESCRIPTION

Examples in accordance with the principles described herein provide detection of incident light through combination of hot carrier generation and avalanche multiplication of the hot carriers. In particular, examples consistent with the principles described herein employ an optical antenna to receive and absorb incident light. Further, an avalanche photodiode coupled to the optical antenna receives from the optical antenna a photocurrent including the hot charge carriers generated in the optical antenna by the incident light absorption. The avalanche photodiode amplifies the photocurrent (i.e., provides photocurrent gain) through avalanche multiplication to increase detection sensitivity. Further, since an absorption spectrum or photo-response of the optical antenna is substantially independent of a band gap of a semiconductor of the avalanche photodiode, effective and efficient detection of incident light may be accomplished in situations where the semiconductor band gap and optical wavelength (i.e., photon energy) of the incident light are poorly matched. As such, according to the principles described herein, an effective and efficient photodetector may be provided using a semiconductor (e.g., silicon) for the avalanche photodiode where the semiconductor would be otherwise substantially unsuitable.

Herein, an 'optical antenna' or 'plasmonic antenna,' is defined as a sub-wavelength structure or device configured to absorb free-space, propagating, electromagnetic radiation (i.e., incident light). In particular, the optical antenna may absorb incident light by coupling free-space electromagnetic radiation into a nano-scale, sub-wavelength region (e.g., of and surrounding the optical antenna), by definition herein. In effect, an optical antenna may be viewed as a nano-scale, optical counterpart to a conventional antenna (e.g., a radio frequency (RF) antenna, a microwave antenna, etc.). However, the optical antenna operates according to plasmonic principles, generally confining the absorbed incident light in the sub-wavelength region as a plasmonic resonance mode (e.g., surface plasmon polariton) of the optical antenna. As with conventional antennas, optical antennas may be tuned to a specific wavelength or range of wavelengths of incident light by selecting various characteristics of the optical antenna (e.g., length, width, gap size, element shape, etc.). As such, optical antennas may be configured to absorb incident light having a target optical wavelength. Herein, an 'optical wavelength' is defined as including wavelengths ranging from the infrared through the ultraviolet range and explicitly including the visible spectrum. According to various examples, an optical antenna may include, but is not limited to, a nanoparticle optical antenna, a nanorod optical antenna, an optical dimer antenna, a bowtie optical antenna, a split-ring optical antenna, a spiral optical antenna, as well as various optical or plasmonic apertures.

In addition to absorbing incident light, optical antennas also generate energetic electron-hole pairs known as 'hot' electron-hole pairs. By 'energetic' or 'hot' it is meant, by definition herein, that charge carriers (i.e., electrons and holes) of the hot electron-hole pair have a generally higher energy level or state when compared to an energy level or state of a surrounding conduction band from which the hot electron-hole pair was generated. According to some examples, the hot electron-hole pairs may be generated from plasmon decay. Each generated hot electron-hole pair may be separated into an individual 'hot' electron and an individual 'hot' hole (e.g., by the application of a electric field). Through separation, the hot electrons and the hot holes may give rise to a photocurrent that is representative of (e.g., proportional to) the incident light, according to some examples.

As used herein, an 'avalanche photodiode' is defined as a semiconductor diode junction that employs avalanche multiplication to enhance a current (e.g., a photocurrent) within the avalanche photodiode. In some examples, the photocurrent may be generated by a photoelectric effect within the semiconductor diode junction, while in other examples, the photocurrent may arise in part or in whole outside of the semiconductor junction. In particular, the photocurrent may include charge carriers (e.g., electrons) that are generated by incident light external to the avalanche photodiode and then emitted or injected into the semiconductor diode junction, by definition herein. In the semiconductor diode junction, the charge carriers of the photocurrent experience avalanche multiplication due to impact ionization leading to photocurrent enhancement or gain, according to various examples. As such, by definition herein, the avalanche photodiode may include, but is not limited to, one or more of a conventional avalanche photodiode, an avalanche photodiode coupled to a photocurrent source, and even an avalanche diode (i.e., non-photoactive) coupled to the photocurrent source. According to various examples, the photocurrent source may be an optical antenna that is coupled to the avalanche photodiode or avalanche diode, where the optical antenna is configured to generate a photocurrent that includes hot carriers of hot electron-hole pairs generated by incident light.

Further, as used herein, the article 'a' is intended to have its ordinary meaning in the patent arts, namely 'one or more'. For example, 'an optical antenna' means one or more optical antennas and as such, 'the optical antenna' means 'the optical antenna(s)' herein. Also, any reference herein to 'top', 'bottom', 'upper', 'lower', 'up', 'down', 'front', 'back', 'left' or 'right' is not intended to be a limitation herein. Herein, the term 'about' when applied to a value generally means within the tolerance range of the equipment used to produce the value, or in some examples, means plus or minus 10%, or plus or minus 5%, or plus or minus 1%, unless otherwise expressly specified. Further, herein the term 'substantially' as used herein means a majority, or almost all, or all, or an amount within a range of about 51% to about 100%, for example. Moreover, examples herein are intended to be illustrative only and are presented for discussion purposes and not by way of limitation.

FIG. 1 illustrates a block diagram of a plasmonic avalanche photodetector 100, according to an example consistent with the principles described herein. The plasmonic avalanche photodetector 100 is configured to receive and absorb incident light 102. The received and absorbed incident light 102, in turn, leads to the generation of an electric current (i.e., a photocurrent) within the plasmonic avalanche photodetector 100. In particular, the photocurrent produced by incident light absorption may be proportional to and thus provide detection of the incident light 102, according to various examples.

The plasmonic avalanche photodetector 100 illustrated in FIG. 1 employs both internal photoemission and avalanche multiplication charge carriers, according to various examples. Internal photoemission within the plasmonic avalanche photodetector 100 may facilitate detection of the incident light 102, including, for example, incident light having a wavelength (or equivalently a photon energy) that is substantially mismatched with respect to a band gap of a semiconductor of the plasmonic avalanche photodetector 100. The internal photoemission may be the result of plasmon decay within the plasmonic avalanche photodetector 100, for example. Avalanche multiplication may enhance sensitivity of the plasmonic avalanche photodetector 100 to the incident light 102, according to various examples.

As illustrated in FIG. 1, the plasmonic avalanche photodetector 100 includes an optical antenna 110. The optical antenna 110 is configured to absorb the incident light 102. The optical antenna 110 is further configured to generate hot electron-hole pairs (i.e., hot charge carrier pairs). The hot electron-hole pairs may be generated by plasmon decay of a plasmon resonance of the optical antenna 110, for example. Further, the generated hot electron-hole pairs may be separated into hot charge carriers or simply 'hot carriers' of differing charge type within the plasmonic avalanche photodetector 100, according to various examples.

Herein, a 'hot charge carrier' or a 'hot carrier' is defined as one or both of a hot electron having a net negative charge and a hot electron hole or 'hot hole' having a net positive charge. According to some examples, an electric field is configured to separate the hot carriers of the generated hot electron-hole pairs by inducing movement of hot carriers of differing charge types in substantially different directions. In particular, the applied electric field may induce movement of a first charge type of hot carrier (e.g., a hot electron) in a first direction and further may induce movement of a second charge type of hot carrier (e.g., hot hole) in a second direction that is substantially opposite or away from the first direction to effect separation of the hot carriers, for example.

According to various examples, the optical antenna 110 may be realized according to any of a variety of antenna types including, but not limited to, one or more of a nanoparticle optical antenna, a nanorod optical antenna, an optical dimer antenna, a bowtie optical antenna, a split-ring optical antenna, and a spiral optical antenna. In other examples, the optical antenna 110 may be realized as an aperture optical antenna. For example, the optical antenna 110 may include, but is not limited to, a rectangular aperture in a plasmonic screen. Further, one or both of type of the optical antenna 110 and a size of an element or elements of the optical antenna 110 may be configured to preferentially absorb incident light 102 having a particular wavelength or range of wavelengths, according to some examples. For example, the optical antenna 110 may be configured (e.g., by selecting an element size, antenna type, etc.) to preferentially absorb incident light 102 having a wavelength between about 1200 nanometers (nm) and about 1700 nm. In another example, an absorption spectrum or photo-response of the optical antenna 110 may be in a range of wavelengths from about 1250 nm to about 1650 nm to cover wavelengths typically associated with telecommunications, for example.

Figure 2A:
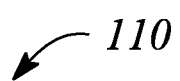
FIG. 2A illustrates a perspective view of a nanorod optical antenna, according to an example consistent with the principles described herein.

FIG. 2A illustrates a perspective view of a nanorod optical antenna 110, according to an example consistent with the principles described herein. In an example, the nanorod optical antenna 110 may be about 100 nm to about 170 nm in length and about 30 nm to about 70 nm (e.g., about 50 nm) wide. In another example, the length may be about 110 to about 160 nm and the width may be about 50 nm. A thickness of the nanorod optical antenna 110 illustrated in FIG. 2A may be substantially similar to the width, according to some examples. The ranges of length mentioned above may provide an absorption spectrum of about 1250 nm to about 1650 nm, according to some examples.

Figure 2B:
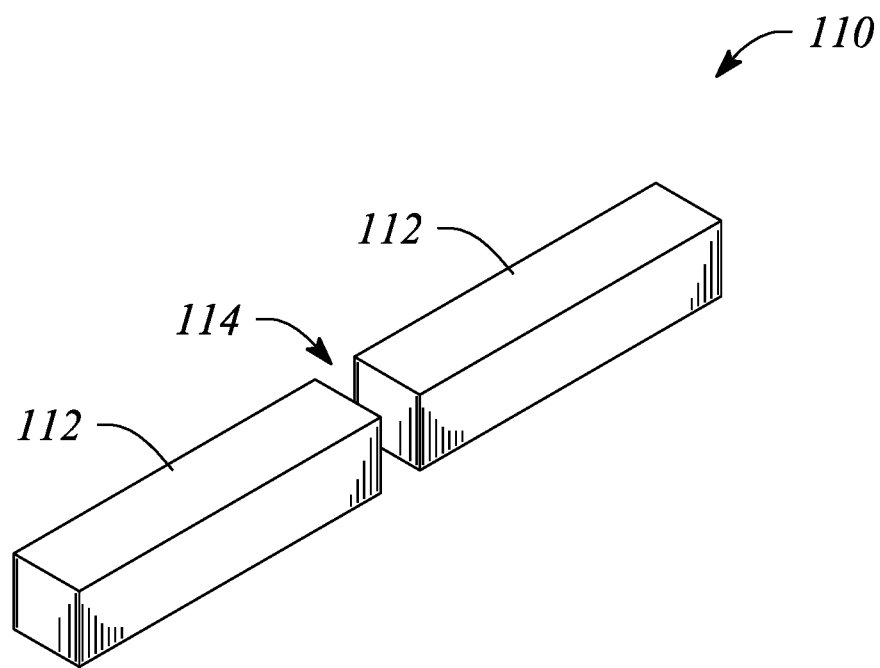
FIG. 2B illustrates a perspective view of an optical dimer antenna, according to an example consistent with the principles described herein.

FIG. 2B illustrates a perspective view of an optical dimer antenna 110, according to an example consistent with the principles described herein. The optical dimer antenna 110 illustrated in FIG. 2B is also known as an 'optical dipole antenna.' As illustrated, the optical dimer antenna 110 may include a pair of antenna elements 112 separate by a gap 114. The gap 114 may serve to concentrate an electromagnetic field associated with plasmonic modes on the optical dimer antenna 110, for example.

Figure 2C:
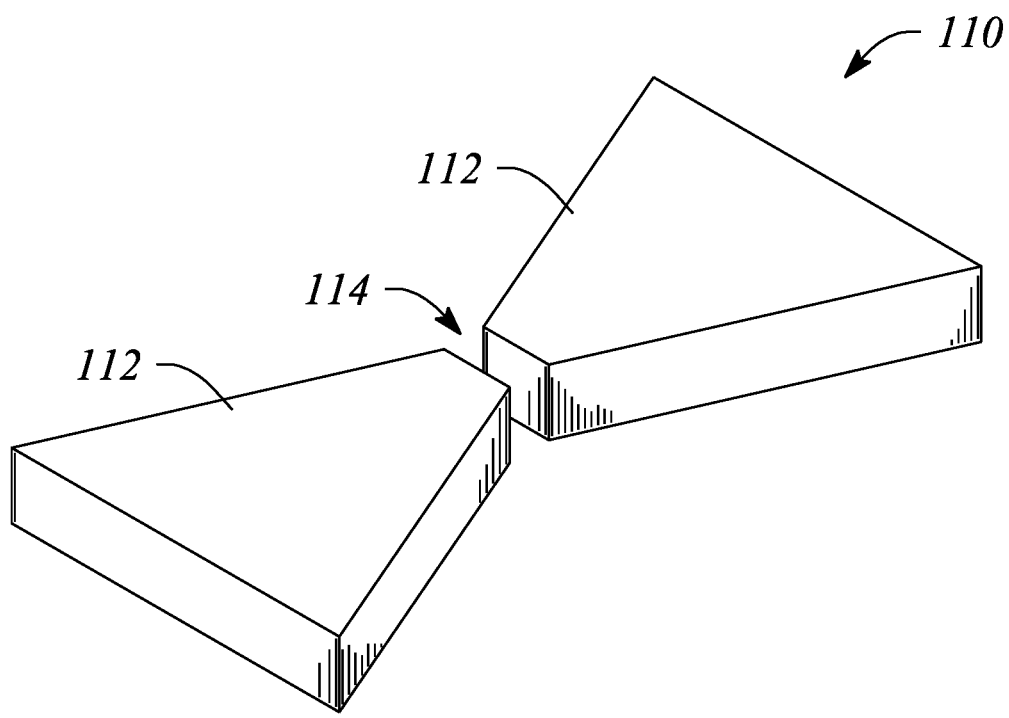
FIG. 2C illustrates a perspective view of a bowtie optical antenna, according to an example consistent with the principles described herein.

FIG. 2C illustrates a perspective view of a bowtie optical antenna 110, according to an example consistent with the principles described herein. The bowtie optical antenna 110 is a type of optical dimer antenna 110 having elements 112 that vary (e.g., increase) in width with distance away from the gap 114 to produce a shape that resembles a 'bowtie.' Dimensions of elements 112 of the optical dimer antenna 110 may be substantially similar to the dimensions of the nanorod optical antenna 110, according to some examples. In particular, dimensions of elements 112 of the bowtie optical antenna 110 may, according to some examples, include a length that is between about 100 nm to about 170 nm and a thickness of between about 20 nm to about 80 nm (e.g., about 50 nm), for example. Further, the elements 112 may increase in width from about 30-70 nm adjacent the gap 114 to about 100-150 nm away from the gap, according to some examples. An amount of increase in the width (i.e., a taper amount) as well as a length of the elements 112 may help determine an absorption spectrum (or bandwidth) of the bowtie optical antenna 110, according to various examples.

While not illustrated, the nanoparticle optical antenna may include one, two or more nanoparticles, each nanoparticle having nano-scale dimensions between a few nanometers and tens of nanometers. In various examples, the nanoparticle may be arranged in dimers, trimers, and so on, as well as other configurations to act as optical antennas. Further, while not explicitly illustrated, the optical antenna 110 may include arrays of more than one individual optical antenna 110, according to some examples.

Referring again to FIG. 1, the plasmonic avalanche photodetector 100 further includes an avalanche photodiode (APD) 120. The APD 120 has an avalanche multiplication region that is coupled to the optical antenna 110, according to various examples. The APD 120 is configured to receive hot carriers of the hot electron-hole pairs from the coupled optical antenna 110. In particular, the hot carriers of a first charge type may be injected or emitted into the avalanche multiplication region of the APD 120 after the hot electron-hole pairs are generated and the hot carriers are separated in the optical antenna 110. Emission or injection may be provided by internal photoemission, for example, as described herein. The APD 120 is further configured to amplify the received hot carriers through avalanche multiplication to produce an amplified photocurrent, for example. According to various examples, hot carriers are emitted into the avalanche multiplication region of the APD 120 across, over or through a 'coupling barrier' associated with an APD-to-optical antenna coupling 130.

In some examples, the avalanche multiplication region of the APD 120 is coupled to the optical antenna 110 by a Schottky junction (i.e., the coupling 130 is, or is provided by, the Schottky junction). In particular, the Schottky junction 130 may be formed between the optical antenna 110 and a semiconductor of the APD 120 to provide the coupling. Further, the Schottky junction 130 may include a semiconductor at the avalanche multiplication region of the APD 120, according to some examples. When coupled by the Schottky junction 130, the coupling barrier may be an energy barrier associated with the Schottky junction 130 (i.e., a Schottky barrier). The hot carriers may be emitted or injected into the avalanche multiplication region of the APD 120 across the Schottky barrier of the Schottky junction 130. As such, emission or injection may be according to internal photoemission, in various examples. In other examples, the optical antenna 110 and the APD 120 are coupled in another manner including, but not limited to, by a tunneling junction 130 between the avalanche multiplication region of the APD 120 and the optical antenna 110. In these examples, the coupling barrier may be a tunneling barrier, for example.

In some examples, the absorbed incident light 102 has a photon energy that is below a band gap energy (i.e., 'band gap') of a semiconductor of the APD avalanche multiplication region. In addition, the photon energy also may be at or above an energy level that facilitates crossing the coupling barrier. In particular, the absorbed incident light 102 may include a photon energy (e.g., an average photon energy hv) that is below the band gap of the APD avalanche multiplication region semiconductor and at or above an energy level that facilitates crossing the Schottky barrier of the Schottky junction 130. For example, the average photon energy hv of the absorbed incident light 102 may be greater than the Schottky barrier $\Phi_B$ and less than the semiconductor band gap $E_g$ (i.e., $\Phi_n < hv < E_g$). As such, the absorbed incident light 102 may provide plasmonically driven internal photoemission of the hot carriers across the Schottky junction 130 and into the APD avalanche multiplication region, according to some examples.

Figure 3:
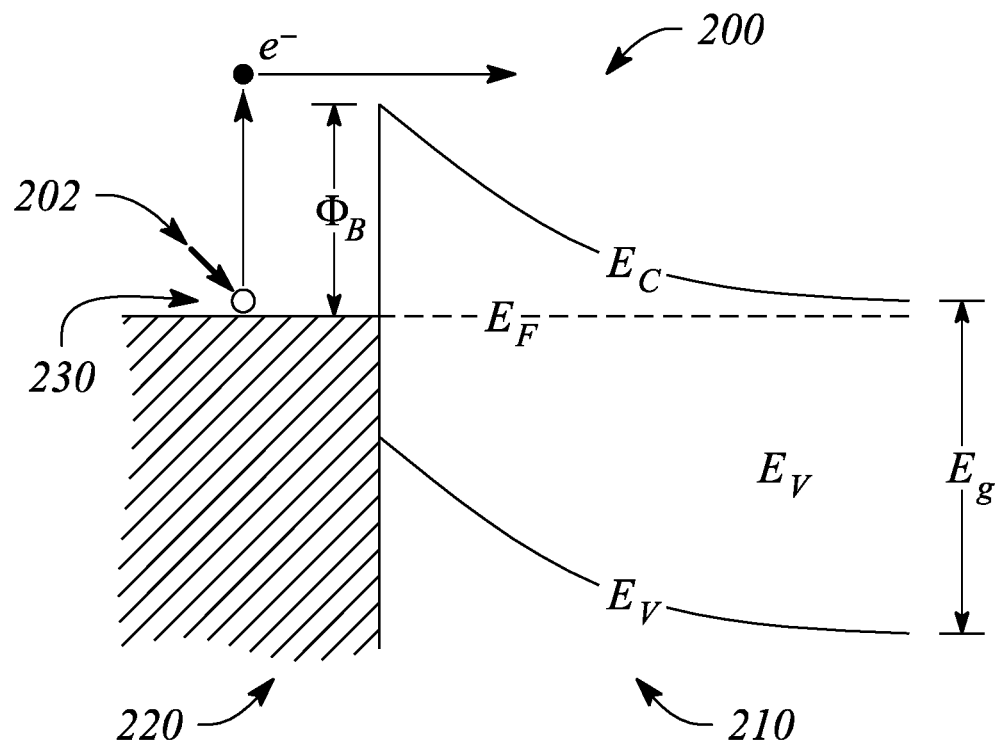
FIG. 3 illustrates a band diagram of a Schottky junction, according to an example consistent with the principles described herein.

FIG. 3 illustrates a band diagram of a Schottky junction 200, according to an example consistent with the principles described herein. The illustrated Schottky junction 200 includes a semiconductor 210 in contact with a metal 220. In particular, the band diagram illustrated in FIG. 3 is for an unbiased Schottky junction 200 that includes an n-type or an n-doped semiconductor 210 having a valance band energy $E_V$ and further having a conduction band energy $E_C$. As illustrated, the semiconductor band gap $E_g$ is a difference between the conduction band energy $E_C$ and the valance band energy $E_V$. A Fermi energy level $E_F$ in the Schottky junction 200 is represented by a dashed line in FIG. 3. Further, as illustrated, the Schottky junction 200 produces a Schottky barrier or Schottky barrier energy on at the semiconductor-metal interface.

In FIG. 3, the metal 220 may be metal of an optical antenna (e.g., the optical antenna 110), while the semiconductor 210 may be a semiconductor of an APD (e.g., the APD 120), for example. According to some examples, light 202 incident on the metal 220 may create a hot electron-hole pair 230 having an electron $e^-$ (i.e., a hot electron) with an energy level that is above or greater than the Schottky barrier $\Phi_B$, as illustrated by an vertical arrow in FIG. 3. Having an energy level above the Schottky barrier 4a, the electron $e^-$ may move across semiconductor-metal interface of the Schottky junction 200 and into the semiconductor 210, as is further illustrated in FIG. 3 by a horizontal arrow. The movement of the hot electron across the Schottky barrier 4o may represent internal photoemission, according to various examples.

According to various examples (and as mentioned above), the Schottky junction 130, 200 of FIGS. 1 and 3 may include a metal-semiconductor junction between the optical antenna 110 and the APD 120, for example between a metal of the optical antenna 110 and the semiconductor of or within the avalanche multiplication region of the APD 120. For example, the optical antenna 110 may include a metal such as, but not limited to, gold, silver, copper or aluminum. In other examples, another noble metal other than gold and silver may be used as the metal of the optical antenna 110. The metal of the optical antenna 110 may be formed or otherwise deposited on a surface of a semiconductor of the APD 120, and more particularly, on a surface of the APD semiconductor within the avalanche multiplication region to provide the Schottky junction 130, for example.

In some examples, the Schottky junction 130 may further include a layer of another metal at an interface between the metal of the optical antenna 110 and the semiconductor of the APD avalanche multiplication region. The other metal layer may be employed to facilitate internal photoemission of the hot carriers by lowering an effective height of the Schottky barrier (i.e., reducing the Schottky barrier energy), according to some examples. Lowering the effective Schottky barrier height may increase a probability that the generated hot carriers have sufficient energy to surpass the Schottky barrier and be emitted across the Schottky junction 130 and into the APD 120, for example. In some examples, the other metal of the layer may include, but is not limited to, titanium (Ti), zinc (Zn), or chromium (Cr). The metal layer (e.g., a titanium layer) may be relatively thin compared to a thickness of the optical antenna 110, according to some examples. For example, the metal layer may have a thickness of less than or equal to about one nanometer (1-nm), while the optical antenna 110 may have an overall thickness of several nanometers to tens of nanometers or more, according to various examples. In some examples, the other metal layer (e.g., Ti) of the Schottky junction 130 may be included to enhance adhesion between the optical antenna metal (e.g., Au, Al, etc.) and a material of the APD 120 (e.g., Si), in addition to or instead of for the purposes of lowering the effective Schottky barrier height.

According to various examples, the APD semiconductor may include, but is not limited to, a semiconductor from group IV, group III-V, and group II-VI, or virtually any other semiconductor or compound semiconductor that may be used to realize an avalanche diode. For example, the semiconductor may include silicon (Si) and the APD 120 may be a silicon APD. In another example, the semiconductor may include germanium and the APD 120 may be a germanium APD. In other examples, the APD 120 may include a combination of Si and another semiconductor such as, but not limited to, germanium (Ge) either in separate layers or in the form of a compound group IV semiconductor. In another example, the semiconductor may include gallium arsenide (GaAs) or indium phosphide (InP) and the APD 120 may be a GaAs APD or an InP APD, respectively. In yet other examples, the APD 120 may be an indium gallium arsenide (InGaAs) based APD, a gallium nitride (GaN) based APD or even a mercury cadmium telluride (HgCdTe) based APD.

According to various examples, the APD 120 includes a semiconductor junction such as a p-n junction or a p-i-n junction. Herein, an APD 120 that includes a p-i-n junction is referred to as a 'p-i-n APD', while an APD 120 that includes a p-n junction is called a 'p-n APD'. The semiconductor junction (i.e., the p-n junction, the p-i-n junction, etc.) of the APD 120 may be reverse biased to provide avalanche breakdown resulting avalanche multiplication (e.g., due to impact ionization) within the avalanche multiplication region of the APD 120, according to various examples. In various examples, the avalanche multiplication region of the APD 120 may include a depletion region of the reverse-biased semiconductor junction. For example, the avalanche multiplication region may be or include the intrinsic or i-doped portion of the p-i-n junction in the p-i-n APD 120.

According to some examples, the APD 120 may have a lateral configuration or structure, while in other examples, the APD 120 may have a vertical structure. Herein, a lateral structure is defined as an orientation of the semiconductor junction of the APD 120 in which current produced by impact ionization (i.e., an amplified photocurrent) flows substantially perpendicular to a direction associated with the movement of hot carriers into the avalanche multiplication region of the APD 120 (i.e., by internal photoemission across the coupling barrier). For example, in a lateral p-i-n APD 120, the optical antenna 110 may be coupled (e.g., by the Schottky junction 130) to a side of the intrinsic or I-doped portion of the p-i-n junction, by definition herein. Conversely, by definition herein, a vertical configuration or structure is defined as an APD 120 having a semiconductor junction orientation in which the amplified photocurrent flows in a direction substantially similar to a direction of hot carrier emission across the coupling barrier.

Figure 4:
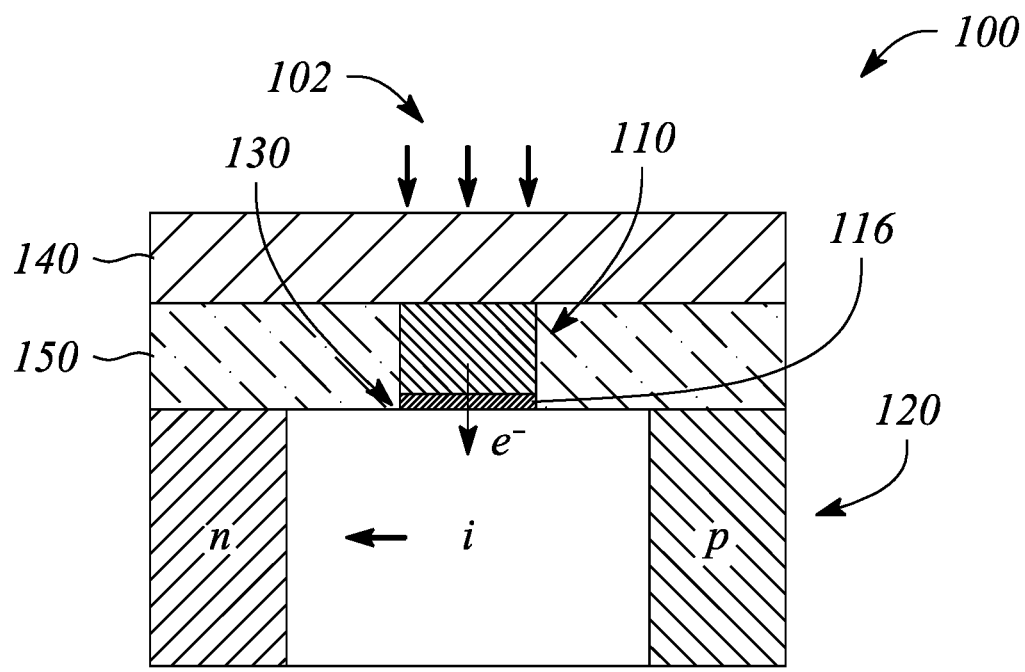
FIG. 4 illustrates a cross sectional view of a plasmonic avalanche photodetector, according to an example consistent with the principles described herein.

FIG. 4 illustrates a cross sectional view of a plasmonic avalanche photodetector 100, according to an example consistent with the principles described herein. In FIG. 4, the plasmonic avalanche photodetector 100 includes an optical antenna 110 coupled to an APD 120 by a Schottky junction 130. In particular, as illustrated, the optical antenna 110 is a nanorod optical antenna 110 and the APD 120 is a lateral p-i-n APD 120. Further, as illustrated, the Schottky junction 130 couples the nanorod optical antenna 110 to an i-region of the lateral p-i-n APD 120. For example, the Schottky junction 130 may be formed between a metal of the nanorod optical antenna 110 and an intrinsic or i-region of a semiconductor (e.g., silicon) of the lateral p-i-n APD 120. The i-region may include or serve as the avalanche multiplication region of the lateral p-i-n APD 120, for example. Also illustrated is a thin (e.g., 1 nm thick) metal layer (e.g., of titanium) 116 between a metal (e.g., gold, silver, etc.) of a bulk of the nanorod optical antenna 110 and the semiconductor i-region of the lateral p-i-n APD 120.

As illustrated in FIG. 4, when incident light 102 is absorbed by the nanorod optical antenna 110, a hot electron $e^-$ may be generated (e.g., as a hot electron-hole pair). In turn, the hot electron $e^-$ may then move across the Schottky junction 130 and into the i-region of the lateral p-i-n APD 120 by internal photoemission, as illustrated by the vertical arrow next to the hot electron e⁻ in FIG. 4. Within the i-region, which serves as the APD avalanche multiplication region, the hot electron $e^-$ may undergo impact ionization resulting in avalanche multiplication. According to various examples, a photocurrent produced by avalanche multiplication may flow in a direction indicated by the horizontal arrow in the i-region of the APD 120 in FIG. 4. The photocurrent flow direction is substantially perpendicular to a direction of hot electron emission into the avalanche multiplication region (i.e., an internal photoemission direction), as illustrated in FIG. 4.

Figure 5:
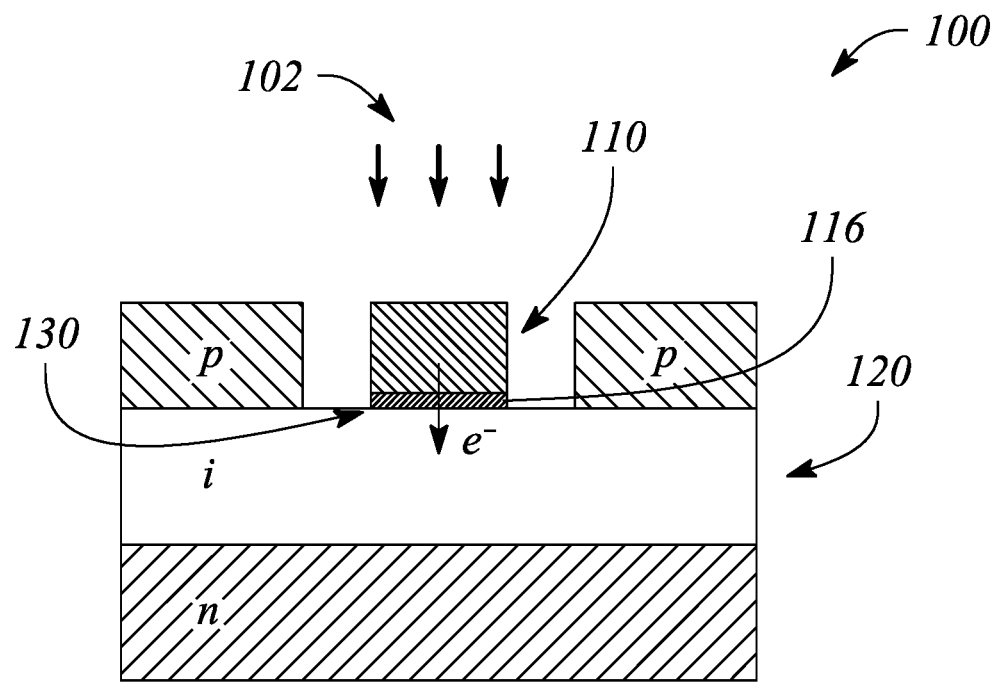
FIG. 5 illustrates a cross sectional view of a plasmonic avalanche photodetector, according to another example consistent with the principles described herein.

FIG. 5 illustrates a cross sectional view of a plasmonic avalanche photodetector 100, according to another example consistent with the principles described herein. In particular, the plasmonic avalanche photodetector 100 illustrated in FIG. 5 includes an optical antenna 110 and an APD 120 having a vertical structure (i.e., a vertical APD). The optical antenna 110 is coupled (e.g., by a Schottky junction 130) to the avalanche multiplication region of the vertical APD 120 through an aperture in a top layer of the vertical APD 120. For example, if the vertical APD 120 is a p-i-n APD, the aperture may be through one of a p-type doped layer (e.g., as illustrated) and an n-type doped layer to facilitate coupling (e.g., formation of the Schottky junction 130) between the optical antenna 110 and an i-layer (i.e., i-region) of the vertical p-i-n APD 120.

Electrical contacts may be provided to bias one or both of the APD 120 (e.g., a junction of the APD) and the Schottky junction 130 between the APD 120 and the optical antenna 110, according to various examples. For example, as illustrated in FIG. 4, a transparent electrode 140 may be used to contact and bias the optical antenna 110. The transparent electrode 140 may include a transparent conductor material such as, but not limited to, indium tin oxide (ITO), for example. A substantially transparent insulator layer 150 such as, but not limited to, silicon dioxide ($SiO_2$) may be used to electrically isolate the transparent electrode 140 from portions of the APD 120 (e.g., as illustrated in FIG. 4). FIGS. 4 and 5 omit illustration of other electrodes, (e.g., for biasing the APD 120) for clarity of illustration and not by way of limitation.

According to some examples, the plasmonic avalanche photodetector 100 may further include a first voltage source (not illustrated in FIGS. 4-5) to reverse bias a semiconductor junction of the APD 120. Reverse biasing the APD junction may facilitate avalanche multiplication by impact ionization within the avalanche multiplication region of the APD 120, according to various examples. Further, according to some examples, the plasmonic avalanche photodetector 100 may include a second voltage source (not illustrated in FIGS. 4-5) configured to separate hot carriers from the generated hot electron-hole pairs at the optical antenna 110. Once separated, the second voltage source may be further configured to move hot carriers into the APD 120 under the influence of an electric field of the second voltage source. For example, the second voltage source may be connected (e.g., via the transparent electrode 140) to reverse bias the Schottky junction 130. The reverse bias may move the hot carriers (e.g., hot electrons) across the Schottky barrier as part of the internal photoemission, for example.

According to some examples of the principles described herein, a plasmonic avalanche photodetection system is provided. The plasmonic avalanche photodetection system is configured to detect incident light. The plasmonic avalanche photodetection system is configured to produce an output that is representative of the incident light. In various examples, the output may be one or both of an electric current (e.g., a photocurrent) through and a voltage across a portion of the plasmonic avalanche photodetection system.

Figure 6:
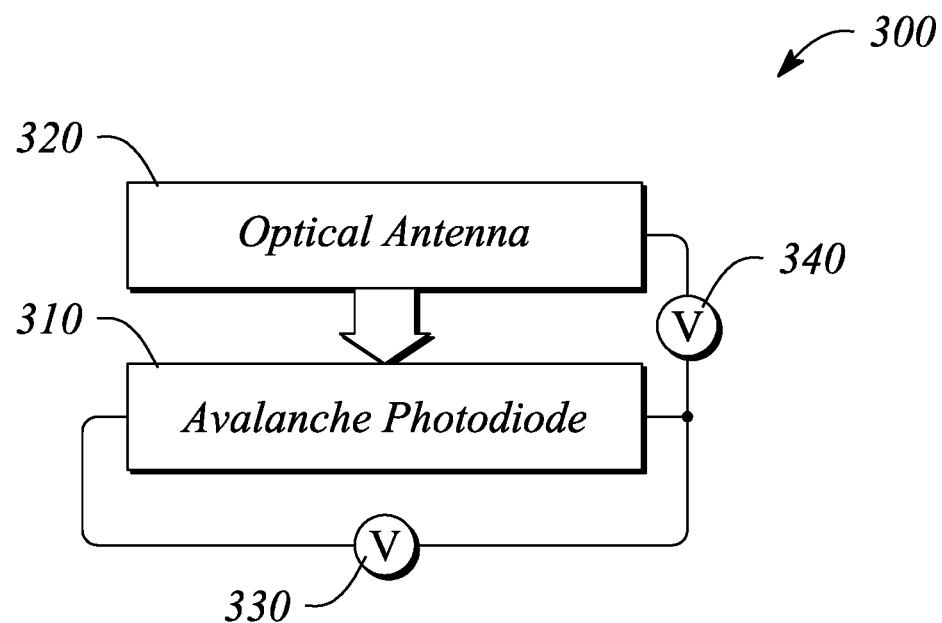
FIG. 6 illustrates a block diagram of a plasmonic avalanche photodetection system, according to an example consistent with the principles described herein.

FIG. 6 illustrates a block diagram of a plasmonic avalanche photodetection system 300, according to an example consistent with the principles described herein. As illustrated, the plasmonic avalanche photodetection system 300 includes an avalanche photodiode (APD) 310, a semiconductor of the APD 310 having a band gap. In some examples, the APD 310 is substantially similar to the APD 120 described above with respect to the plasmonic avalanche photodetector 100.

In particular, in some examples, the APD 310 may be either a p-n APD or a p-i-n APD. Further, according to some examples, the APD 310 may have a structure or configuration that is either lateral or vertical, as described above. For example, the APD 310 may be a lateral p-i-n APD. In another example, the APD 310 may be a vertical p-i-n APD.

Further, according to various examples, the semiconductor of the APD 310 may include, but is not limited to, a group IV semiconductor, a group III-V compound semiconductor, or a group II-VI compound semiconductor. For example, the semiconductor of the APD 310 may be silicon. In another example, the semiconductor may include, but is not limited to, germanium, gallium arsenide (GaAs), aluminum gallium arsenide (AlGaAs), gallium nitride (GaN), and indium phosphide (InP).

The plasmonic avalanche photodetection system 300 further includes an optical antenna 320. The optical antenna 320 is coupled to the APD 310 by a Schottky junction. According to various examples, hot carriers generated by light incident on the optical antenna 320 are to be emitted into an avalanche multiplication region of the APD 310 across the Schottky junction by internal photoemission. In some examples, the optical antenna 320 is substantially similar to the optical antenna 110 described above with respect to the plasmonic avalanche photodetector 100.

In particular, the optical antenna 320 is configured to absorb the incident light and to generate hot electron-hole pairs by plasmon decay of a plasmon resonance of the optical antenna 320, according to various examples. The optical antenna 320 may be configured to preferentially absorb incident light having a particular wavelength or range or wavelengths (i.e., a predetermined absorption spectrum or photo-response). According to various examples, the optical antenna 320 may be realized according to any of a variety of antenna types including, but not limited to, a nanoparticle optical antenna, a nanorod optical antenna, an optical dimer antenna, a bowtie optical antenna, and a rectangular aperture optical antenna. For example, the optical antenna 320 may be or include a nanorod optical antenna having a length of about 100 nm to about 170 nm, a width of about 20 nm to about 70 nm and a height that is substantially similar to the width. In some examples, the optical antenna 320 includes a metal such as, but not limited to, gold, silver, copper or aluminum. For example, the optical antenna 320 may include gold and the APD 310 may include silicon.

In some examples, the Schottky junction is formed between the metal of the optical antenna 320 and the semiconductor of the APD 310. In some examples, the Schottky junction includes a layer of another metal in addition to the metal of the optical antenna 320. In particular, the other metal of the layer differs from the metal of bulk of the optical antenna 320, according to some examples. In some examples, the other metal layer is titanium. Further, the other metal layer may be relatively thin (e.g., about 1 nm) compared to an overall thickness of the optical antenna 320 (e.g., about 20 nm to about 70 nm thick), according to some examples.

According to some examples, a photon energy of the incident light is less than the semiconductor band gap of the APD semiconductor. Further, the photon energy may be about equal to or greater than a Schottky barrier energy (i.e., a Schottky barrier height) of the Schottky junction, according to some examples. In some examples, the plasmonic avalanche photodetection system 300 further includes a heater (not illustrated). The heater is configured to heat the Schottky junction and to increase a probability of thermoionic hot carrier emission over the Schottky barrier of the Schottky junction.

As illustrated in FIG. 6, the plasmonic avalanche photodetection system 300 further includes a first voltage source 330. The first voltage source 330 is configured to reverse bias a semiconductor junction of the APD 310. Reverse biasing may facilitate avalanche multiplication by impact ionization within the avalanche multiplication region of the APD 310, according to various examples.

As illustrated in FIG. 6, the plasmonic avalanche photodetection system 300 further includes a second voltage source 340. The second voltage source 340 is configured to reverse bias the Schottky junction and to induce movement of the hot carriers across the Schottky barrier of the Schottky junction. In particular, the second voltage source 340 provides a reverse bias to the Schottky junction to separate the generated hot electron-hole pairs into hot carriers of differing charge types (e.g., hot electrons and hot holes) and then to induce movement of a selected charge type of the hot carriers (e.g., hot electrons) toward and then across the Schottky junction and into the avalanche multiplication region of the APD 310.

Figure 7:
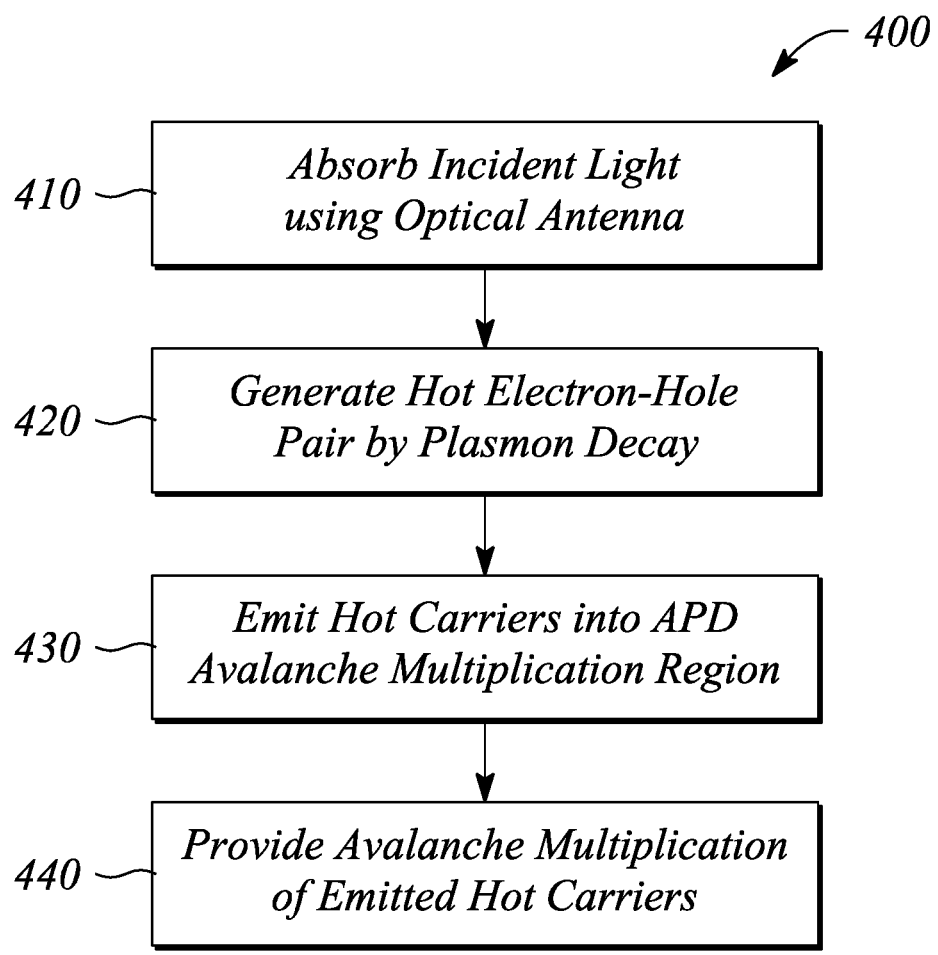
FIG. 7 illustrates a flow chart of a method of plasmonic avalanche photodetection, according to an example consistent with the principles described herein.

According to various examples of the principles described herein, a method of plasmonic avalanche photodetection is provided. FIG. 7 illustrates a flow chart of a method 400 of plasmonic avalanche photodetection, according to an example consistent with the principles described herein. As illustrated in FIG. 7, the method 400 of plasmonic avalanche photodetection includes absorbing 410 incident light using an optical antenna. The absorbed 410 light may induce a plasmon resonance of the optical antenna, according to various examples. In some examples, the optical antenna may be substantially similar to the optical antenna 110 of the plasmonic avalanche photodetector 100, described above.

The method 400 of plasmonic avalanche photodetection further includes generating 420 hot electron-hole pairs by plasmon decay of the plasmon resonance induced by the absorbed light. The method 400 of plasmonic avalanche photodetection further includes emitting 430 hot carriers of the hot electron-hole pairs into an avalanche multiplication region of an avalanche photodiode (APD) coupled to the optical antenna. The emitted 430 hot carriers may be either hot electrons or hot holes. Emitting 430 hot carriers may include internal photoemission, according to some examples. For example, hot electrons may be emitted 430 by internal photoemission into the APD.

According to some examples, the APD may be substantially similar to the APD described above with respect to the plasmonic avalanche photodetector 110. Moreover, the optical antenna and the APD may be coupled in a manner that is substantially similar to that described above for the optical antenna 110 and the APD 310 of the plasmonic avalanche photodetector 110. For example, the optical antenna and APD may be coupled by a Schottky junction and the hot carriers may be emitted 430 by crossing a Schottky barrier of the Schottky junction.

As illustrated in FIG. 7, the method 400 of plasmonic avalanche photodetection further includes providing 440 avalanche multiplication of the emitted 430 hot carriers. Avalanche multiplication may be provided 440 within the avalanche multiplication region of the APD according to various examples. Avalanche multiplication is configured to produce an amplified photocurrent in the APD. In particular, avalanche multiplication produces that amplified photocurrent from the emitted 430 hot carriers by impact ionization, according to some examples. The amplified photocurrent may represent detection of the incident light, according to various examples.

Thus, there have been described examples of a plasmonic avalanche photodetector, a plasmonic avalanche photodetection system and a method of plasmonic avalanche photodetection that transform incident light into hot carriers, which are then subjected to avalanche multiplication to produce a photocurrent. It should be understood that the above-described examples are merely illustrative of some of the many specific examples that represent the principles described herein. Clearly, those skilled in the art can readily devise numerous other arrangements without departing from the scope as defined by the following claims.

What is claimed is:

1. A plasmonic avalanche photodetector comprising:
   an optical antenna to absorb incident light and to generate hot electron-hole pairs by plasmon decay of a plasmon resonance of the optical antenna; and
   an avalanche photodiode (APD) having an avalanche multiplication region coupled to the optical antenna, the APD to receive hot carriers of the hot electron-hole pairs emitted into the avalanche multiplication region from the coupled optical antenna and to produce an amplified photocurrent through avalanche multiplication of the received hot carriers.

2. The plasmonic avalanche photodetector of claim 1, wherein the avalanche multiplication region of the APD is coupled to the optical antenna by a Schottky junction between the optical antenna and the APD, the hot carriers to be emitted into the avalanche multiplication region across a Schottky barrier of the Schottky junction.

3. The plasmonic avalanche photodetector of claim 2, wherein the absorbed incident light has a photon energy that is below a band gap of a semiconductor of the APD avalanche multiplication region and above an energy level that facilitates crossing the Schottky barrier of the Schottky junction to provide plasmonically driven internal photoemission of the hot carriers across the Schottky junction and into the APD avalanche multiplication region.

4. The plasmonic avalanche photodetector of claim 2, wherein the Schottky junction comprises a metal-semiconductor junction between a metal of the optical antenna and a semiconductor of the APD avalanche multiplication region.

5. The plasmonic avalanche photodetector of claim 4, wherein the Schottky junction further comprises a layer of titanium at an interface between the optical antenna metal and the APD avalanche multiplication region semiconductor, the titanium layer having a thickness less than or equal to about one nanometer, and wherein the optical antenna metal comprises one or more of gold, silver, copper, and aluminum.

6. The plasmonic avalanche photodetector of claim 1, wherein the optical antenna comprises one or more of a nanoparticle optical antenna, a nanorod optical antenna, an optical dimer antenna, and a bowtie optical antenna.

7. The plasmonic avalanche photodetector of claim 1, wherein the APD comprises a lateral p-i-n APD.

8. The plasmonic avalanche photodetector of claim 1, wherein the avalanche multiplication region of the APD comprises silicon, and wherein the optical antenna is to absorb incident light having a wavelength between about 1200 nanometers and about 1700 nanometers.

9. A plasmonic avalanche photodetection system comprising the plasmonic avalanche photodetector of claim 1 and further comprising:
a first voltage source to reverse bias a semiconductor junction of the APD and to facilitate avalanche multiplication by impact ionization within the avalanche multiplication region of the APD; and
a second voltage source to separate hot carriers from the generated hot electron-hole pairs, the hot carriers to move into the APD under the influence of an electric field of the second voltage source.

10. The plasmonic avalanche photodetector of claim 1, wherein the APD comprises an all-silicon APD.

11. The plasmonic avalanche photodetector of claim 1, wherein the optical antenna is a bowtie optical antenna comprising two antenna elements separated by a gap, each antenna element having a first end adjacent to the gap having a first width and a second end opposite the first end having a second width greater than the first width, such that the width of each antenna element increases along a length of the antenna element from the first end to the second end.

12. A plasmonic avalanche photodetection system comprising:
an avalanche photodiode (APD), a semiconductor of the APD having a band gap;
an optical antenna coupled to the APD by a Schottky junction, hot carriers generated by light incident on the optical antenna to be emitted into an avalanche multiplication region of the APD across the Schottky junction by internal photoemission;
a first voltage source to reverse bias a semiconductor junction of the APD and to facilitate avalanche multiplication by impact ionization within the avalanche multiplication region of the APD; and
a second voltage source to reverse bias the Schottky junction and to induce movement of the hot carriers across a Schottky barrier of the Schottky junction.

13. The plasmonic avalanche photodetection system of claim 12, wherein the Schottky junction comprises a layer of titanium sandwiched between a metal of the optical antenna and the APD semiconductor.

14. The plasmonic avalanche photodetection system of claim 13, wherein the APD semiconductor comprises silicon and the optical antenna metal comprises one or more of gold, silver, copper and aluminum.

15. The plasmonic avalanche photodetection system of claim 12, wherein a photon energy of the incident light is less than the semiconductor band gap and greater than a Schottky barrier energy of the Schottky junction.

16. The plasmonic avalanche photodetection system of claim 12, further comprising a heater to heat the Schottky junction and to increase a probability of thermo-ionic hot carrier emission over the Schottky barrier.

17. The plasmonic avalanche photodetection system of claim 12, wherein the APD comprises an all-silicon APD.

18. A method of plasmonic avalanche photodetection, the method comprising:
absorbing incident light using an optical antenna, the absorbed incident light inducing a plasmon resonance of the optical antenna;
generating hot electron-hole pairs by plasmon decay of the plasmon resonance induced by the absorbed incident light;
emitting hot carriers of the hot electron-hole pairs into an avalanche multiplication region of an avalanche photodiode (APD) coupled to the optical antenna; and
providing avalanche multiplication of the emitted hot carriers within the avalanche multiplication region of the APD to produce an amplified photocurrent in the APD.

19. The method of plasmonic avalanche photodetection of claim 18, wherein the APD comprises an all-silicon APD.

20. The method of plasmonic avalanche photodetection of claim 18, wherein the optical antenna is a bowtie optical antenna comprising two antenna elements separated by a gap, each antenna element having a first end adjacent to the gap having a first width and a second end opposite the first end having a second width greater than the first width, such that the width of each antenna element increases along a length of the antenna element from the first end to the second end.

* * * * *